(12) United States Patent
Tester

(10) Patent No.: US 7,062,695 B2
(45) Date of Patent: Jun. 13, 2006

(54) MEMORY IMPLEMENTATION FOR HANDLING INTEGRATED CIRCUIT FABRICATION FAULTS

(75) Inventor: David Tester, Preston (GB)

(73) Assignee: LSI Logic Corporation, Milpitas, CA (US)

( * ) Notice: Subject to any disclaimer, the term of this patent is extended or adjusted under 35 U.S.C. 154(b) by 439 days.

(21) Appl. No.: 10/444,891

(22) Filed: May 23, 2003

(65) Prior Publication Data

US 2004/0237009 A1    Nov. 25, 2004

(51) Int. Cl.
*G01R 31/28* (2006.01)
(52) U.S. Cl. .................................. 714/733; 714/723
(58) Field of Classification Search ................ 365/200, 365/230.06; 714/711, 718, 710, 733, 723
See application file for complete search history.

(56) References Cited

U.S. PATENT DOCUMENTS

| | | | |
|---|---|---|---|
| 6,181,614 B1 * | 1/2001 | Aipperspach et al. | 365/200 |
| 6,643,195 B1 * | 11/2003 | Eldredge et al. | 365/200 |
| 6,728,910 B1 * | 4/2004 | Huang | 714/711 |
| 6,801,471 B1 * | 10/2004 | Viehmann et al. | 365/230.06 |

* cited by examiner

*Primary Examiner*—David Ton
(74) *Attorney, Agent, or Firm*—Christopher P. Maiorana, P.C.

(57) ABSTRACT

The present invention may provide a circuit generally having a plurality of addressable memory cells and an access control circuit. The access control circuit may be configured to intercept an access to a faulty cell of the plurality of addressable memory cells. The access control circuit may be further configured to redirect the access to a spare cell of the plurality of addressable memory cells.

23 Claims, 3 Drawing Sheets

MEMORY IMPLEMENTATION FOR HANDLING INTEGRATED CIRCUIT FABRICATION FAULTS

FIELD OF THE INVENTION

The present invention may relate to an implementation of memory within an integrated circuit. One aspect of the invention may relate to an implementation that may reduce the detrimental effect of a fabrication fault.

BACKGROUND TO THE INVENTION

Complicated system on a chip (SoC), application-specific integrated circuits (ASICs) and application-specific signal processors (ASSPS) often are large and employ significant amounts of on-chip random-access memory (RAM). Such a large circuit means that the smallest possible geometry fabrication process should be used to achieve a die size that is cost effective for manufacture. However, conventional bit cells of a RAM are optimised aggressively for a minimum cell area. It is often the case that integrated circuits with large amounts of on-chip RAM are vulnerable to fabrication errors when a small geometry fabrication process is used. Fabrication yields can be unacceptably low, especially while an immature fabrication process is tuned. Low yield of an integrated circuit product that has an inherently large die size results in excessively high manufacturing costs.

SUMMARY OF THE INVENTION

The present invention may provide a circuit generally comprising a plurality of addressable memory cells and an access control circuit. The access control circuit may be configured to intercept an access to a faulty cell of the plurality of addressable memory cells. The access control circuit may be further configured to redirect the access to a spare cell of the plurality of addressable memory cells.

Advantages, features and objects of the present invention may include: (i) enabling a memory to be operative even though one or more memory cells may be faulty; (ii) providing a memory having a built-in fault-tolerant redundancy; (iii) increasing an effective fabrication yield; (iv) automatically detecting faulty memory cells; and/or (v) automatically patching a detected faulty memory cell. Other advantages, features and objects of the invention will be apparent from the following description, claims and/or drawings.

BRIEF DESCRIPTION OF THE DRAWINGS

Non-limiting preferred embodiments of the invention are now described, by way of example only, with reference to the appended claims and accompanying drawings, in which:

DETAILED DESCRIPTION OF PREFERRED EMBODIMENTS

Figure 1:
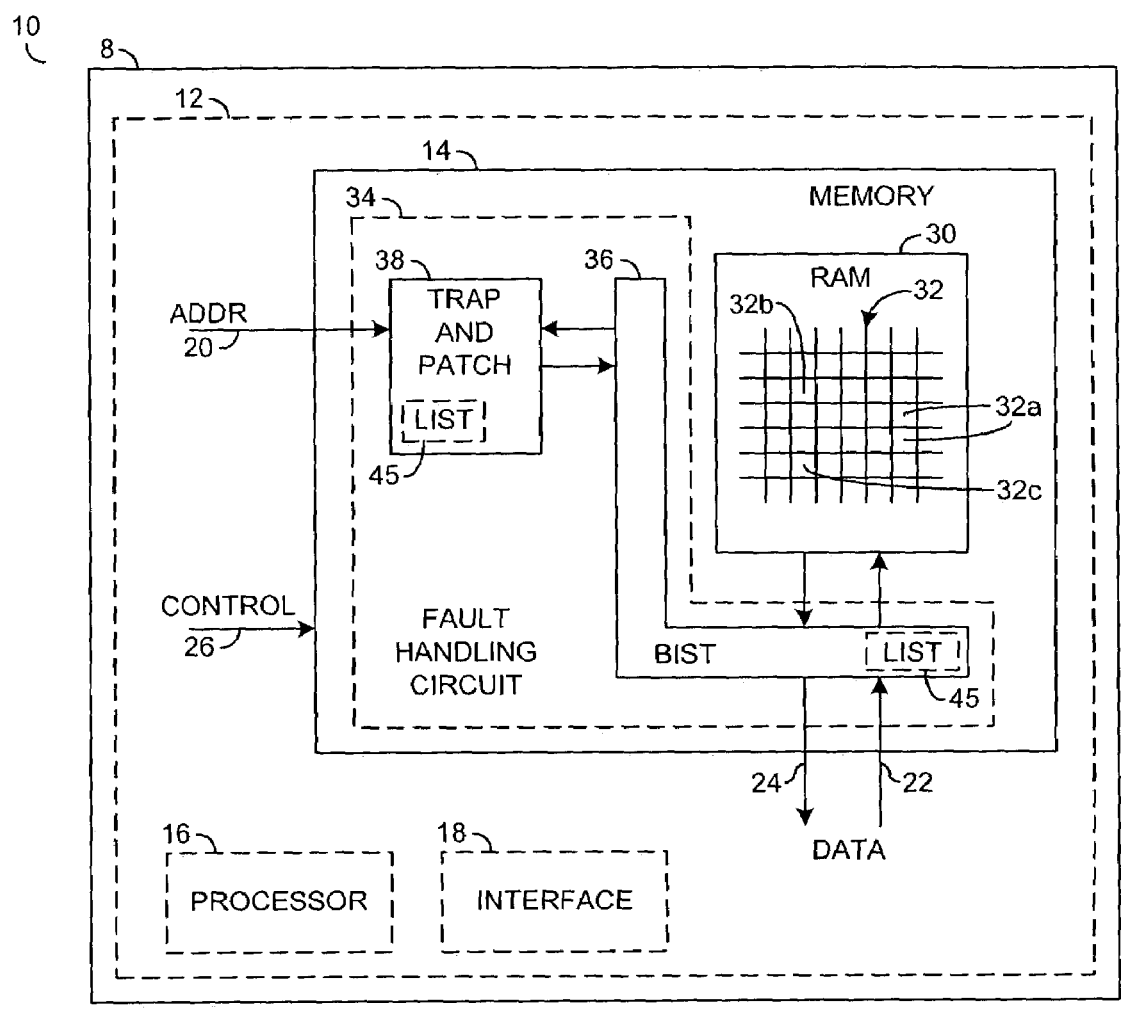
FIG. 1 is a schematic block diagram showing a fault-tolerant memory implementation in a first embodiment of an integrated circuit.

Referring to FIG. 1, an integrated circuit 10 may comprise a die 8 carrying circuitry 12 including built-in memory 14. The circuitry 12 may include other on-chip functional circuits, for example, a processor 16 and/or an interface circuit 18. The integrated circuit 10 may be a SoC circuit. The integrated circuit 10 may be an ASIC or an ASSP. The memory 14 may be an addressable RAM. Additionally or alternatively, the memory 14 may be a buffer. The buffer may be a first-in first-out (FIFO) buffer. The memory 14 may (i) interconnect first and second on-chip circuits (for example, the processor 16 and the interface circuit 18) within the integrated circuit 10, or (ii) be used to interconnect on-chip circuitry (for example, the processor 16 or the interface circuit 18) and off-chip circuitry (not shown). Although only a single region of memory 14 is illustrated in FIG. 1, the integrated circuit may include plural memories 14.

The memory 14 may generally be coupled to one or more of: an address line 20 for receiving a memory address signal (e.g., ADDR) from an external circuit; a data-in line 22 for receiving data to be stored in the memory 14; and a data out line 24 for providing an output of data read from the memory 14. The memory may also be coupled to one or more control signal lines 26 for receiving control signals (e.g., CONTROL, such as read and/or write controls). The term "external" may refer to a circuit that is not part of the memory 14. The external circuit may be on-chip or off-chip of the die 8.

The memory 14 may generally comprise a memory bank 30 of addressable memory cells 32, and fault-handling circuitry 34 (access control circuitry). Each cell 32 may be a bit cell for storing a single bit of information. In one embodiment, each cell 32 may be a multi-bit cell. Each cell 32 may have a layout that is optimised for area (e.g., to occupy a small area). The cells 32 may be categorized as (a) non-faulty cells 32a, (b) faulty cells 32b, or (c) spare cells 32c. The non-faulty cells 32a may be directly addressable. The faulty-cells 32b may be substantially non-functioning or incorrectly-functioning cells. The faulty cells 32b may result from a fabrication process that is imperfect or is not yet sufficiently tuned (e.g., optimized). The faulty cells 32b may also result from fabrication inaccuracies that may be inherent in a fabrication process. For example, atoms and/or molecules may not be deposited or diffused in exact desired positions. Additionally or alternatively, the faulty cells 32b may result from a cell topography approaching a geometry limit or resolution of the fabrication process. The spare cells 32c may be used by the fault-handling circuitry 34 to "patch" the faulty cells 32b. The spare cells 32c may be dedicated cells that may not be used other than for the purpose of patching the faulty cells 32b. The spare cells 32c may be addressable only by the fault-handling circuitry 34. Alternatively, the spare cells 32c may be a sub-set of the non-faulty cells 32a that may be reservable by the fault-handling circuitry 34. Reserving a subset of the non-faulty cells 32a may have an advantage of avoiding a hardware overhead of dedicated cells for the spare cells 32c, and provide flexibility to adapt to a number of faulty cells 32b that may be detected. However, a trade-off may be that a normal capacity of the non-faulty cells 32a may be reduced. Nevertheless, in many cases, the capacity of the memory bank 30 may be slightly greater than may be specified for a particular circuit application to provide a degree of tolerance in the circuit performance. For example, in the case of a FIFO buffer type of memory 14 interconnecting two functional circuits, a slightly oversize capacity may exist to accommodate speed differences between the circuits. The invention may enable the excess capacity to be used to "patch" the faulty cells 32*b* in the FIFO buffer, at a slight expense in buffer capacity. The memory 14 including the fault-handling circuitry 34 may be referred to as fault-tolerant.

Figure 2:
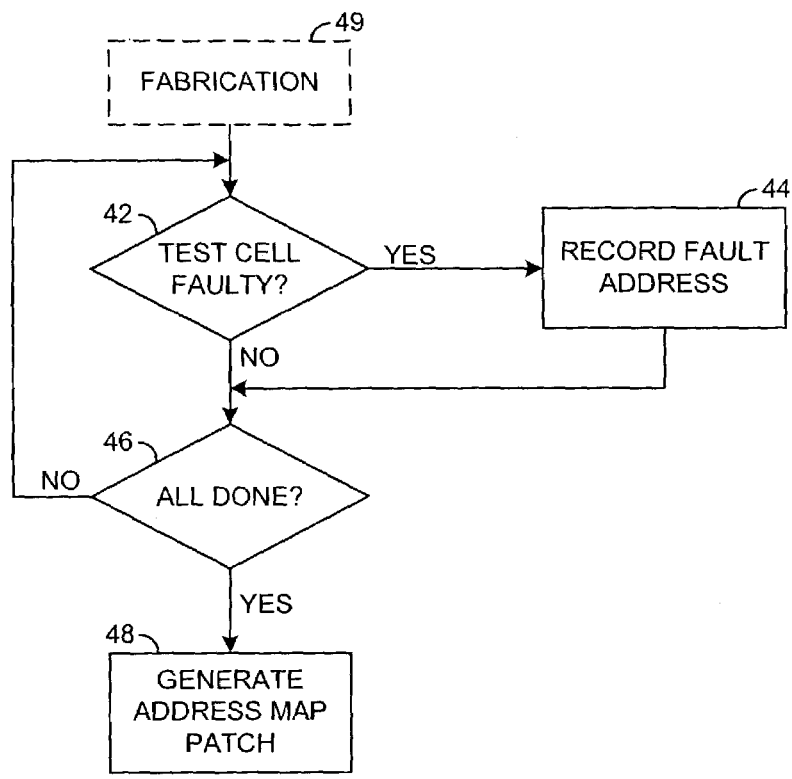
FIG. 2 is a schematic flow diagram illustrating testing of faulty memory elements by fault-handling circuitry of the memory.

The fault-handling circuitry 34 may generally be configured to test each cell 32 and/or to map the addresses of the faulty cells 32*b* to the spare cells 32*c*, to "patch" the faulty cells 32*b*. The fault-handling circuitry 34 may generally comprise memory bank test circuitry 36 (which may also be referred to as built-in system test (BIST) circuitry), and address patch circuitry 38 (which may also be referred to as trap-and-patch circuitry). Referring to FIGS. 1 and 2, the test circuitry 36 may be configured (step 42) to test each memory cell 32 to determine which, if any, of the memory cells 32 may be a faulty cell 32*b*. A faulty cell 32*b* may be detected by writing one or more different values to the cell, and reading back each value after storage. A fault may be indicated by the read-back value not matching the value written. When the cell 32 may be detected to be faulty, the process may branch to step 44 at which the address of the faulty cell 32*b* within the memory bank 30 may be recorded in a fault list 45. The fault list may be stored in the test circuitry 36, or in the address patch circuitry 38. The fault list 45 may be stored in a non-volatile structure. At step 46, the process may be repeated until all of the memory cells 32 may have been tested. At step 48, an address map may be generated for mapping the faulty cells 32*b* in the fault list 45 to the spare cells 32*c*. As mentioned above, the spare cells 32*c* may be additional cells dedicated for the patch function. The test circuitry 36 may test the additional spare cells 32*c* in a similar manner to that described above. Testing the spare cells 32*c* may ensure that should any of the spare cells 32*c* be faulty, such faulty spare cells 32*c* may not be allocated to patch the faulty cells 32*b*. Additionally, or alternatively, the spare cells 32*c* may be implemented to have a large bit cell size that is less vulnerable to fabrication faults than the cells 32*a*. Also as mentioned above, the spare cells 32*c* may be a sub-set of the non-faulty cells 32*a* that may be reservable by the test circuitry 36. In that case, carrying out step 48 after the test steps 42–46 may ensure that the subset of cells 32*c* may itself be free of any faulty cells.

The test circuitry 36 may be (i) dedicated circuitry associated with the memory bank 30, or (ii) dedicated circuitry associated with plural memories 14 within the integrated circuit 10, or (iii) part of global BIST circuitry implemented within the integrated circuit 10 for testing multiple circuits of, or substantially all of, the circuitry 12. The test circuitry 36 may be operative to test the cells 32 only during a test mode of operation of the integrated circuit 10. The testing may be carried out after fabrication (shown schematically in FIG. 2 as step 49) and before the integrated circuit 10 may first be used in an application environment. The test circuitry 36 may be configured to test each cell 32 only once or upon each power-up. The built-in testing and patching operation may be substantially autonomous, such that the memory 14 may be substantially self-patching or "self repairing".

Figure 3:
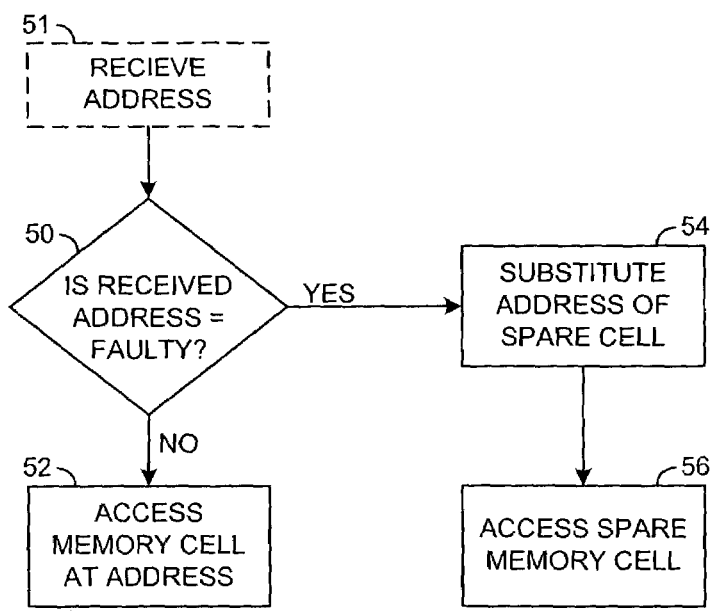
FIG. 3 is a schematic flow diagram illustrating functional replacement of faulty cells by spare non-faulty cells in use of the memory.

Referring to FIGS. 1 and 3, in use of the integrated circuit 10 in an application environment, the address patch circuitry 36 may function to map the received address signal ADDR (e.g., step 51) on the address line 20 to non-faulty cells 32*a* or spare cells 32*c*. At step 50, an address received on the address line 20 may be compared with the fault list 45 to determine whether the address may refer to a faulty cell 32*b*. When at step 50 a non-faulty cell 32*a* may be identified, the process may proceed to step 52 at which the address patch circuitry 36 may pass the address information unmodified to the memory bank 30 to address the respective cell 32*a* within the memory bank 30. Data may be written to the addressed cell 32*a* via the data-in line 22 or read from the cell 32*a* via the data-out line 24. When at step 50 a faulty cell 32*b* may be identified, the process may proceed to step 54 at which an address of a respective spare cell 32*c* may be substituted as new or modified address information. The address information may be referred to as "trapped and patched". The process may then proceed to step 56 at which the modified address information may be provided to the memory bank 30 to access the respective spare cell 32*c* instead of the faulty cell 32*b*. Data may be written to the addressed spare cell 32*c* via the data-in line 22 or read from the cell 32*c* via the data-out line 24.

Figure 4:
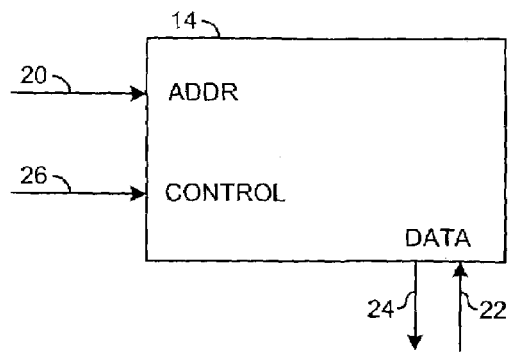
FIG. 4 is a schematic block diagram showing how the memory of FIG. 1 appears to components external to the memory.

Referring to FIG. 4, the internal "patching" of faulty cells 32*b* within the memory 14 may not affect the manner in which the memory 14 may be addressed and/or may operate as seen by external circuits. The external circuits (e.g., 16, 18) may use and address the memory 14 in the same manner as any addressable memory. For example, addresses for the spare cells 32*c* may be outside a normal address range used to access the memory via the signal ADDR. Such an implementation of the memory 14 may be extremely advantageous in enabling the memory 14 with the internal fault-handling circuitry to be used in place of a conventional addressable memory within a design of any integrated circuit, and without involving substantial changes to other circuitry of the integrated circuit.

Figure 5:
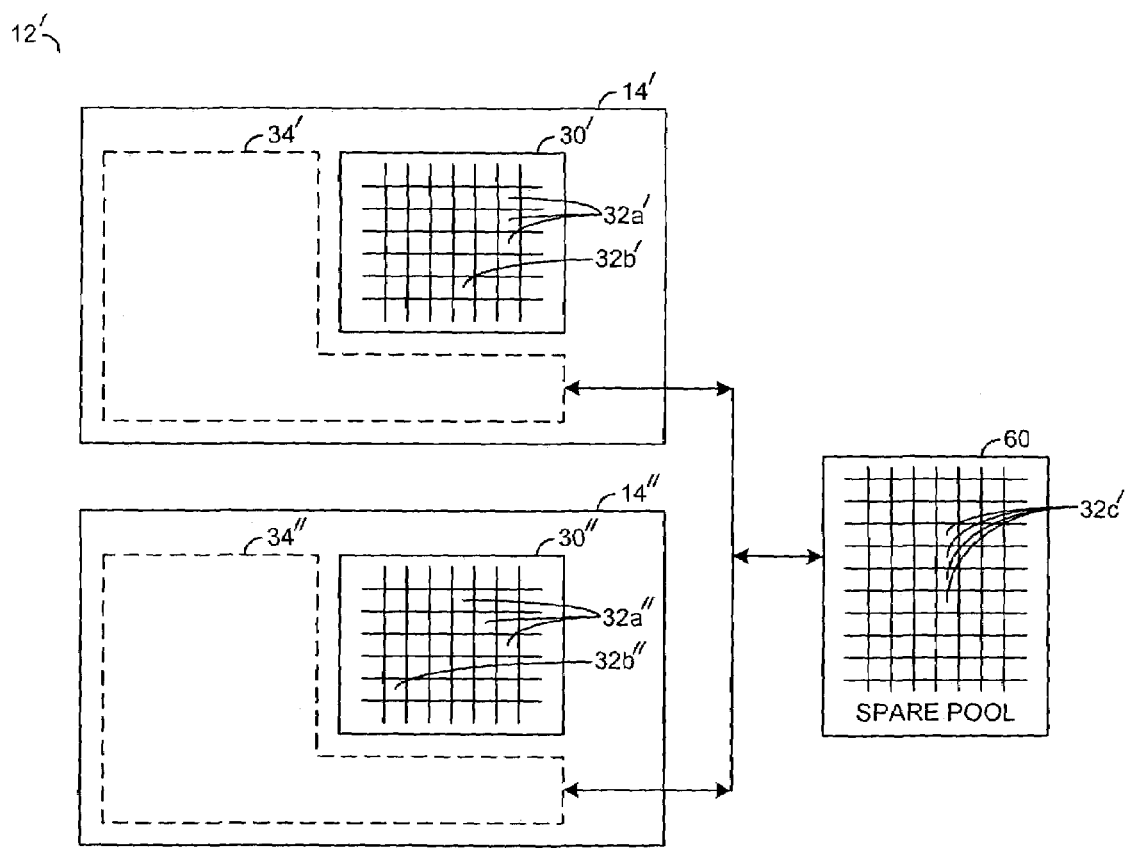
FIG. 5 is a schematic block diagram showing a second embodiment employing a dedicated patch memory.

FIG. 5 may illustrate a second embodiment similar to the first embodiment. The same reference numerals (primed) may denote features equivalent to those described in the first embodiment. The circuitry 12' of the second embodiment may include plural memories 14' and 14", and an additional spare memory 60 for providing the spare cells 32*c'*. The spare memory 60 may communicate with the fault-handling circuitry 34', 34" of each memory 14', 14". In the second embodiment, the spare memory 60 may provide a "pool" of spare cells 32*c'* that may be allocated to any of the memories 14', 14". Such an implementation may enable the full capacity of each memory 14', 14" to be used, and may avoid any hardware overhead of providing dedicated spare cells 32*c'* within each memory 14', 14" that might not be fully used should the respective memory 14', 14" be relatively fault-free. The above implementation may also be especially suitable if the useable capacity of each memory 14', 14" may be important and/or to accommodate patching of a relatively large number of faulty-cells 32*b'* in either memory. The spare memory 60 may be tested prior to allocating any of the spare cells 32*c'*, in a similar manner to that described previously for the memories 14', 14". Testing the spare memory 60 may enable any faulty cells in the spare memory 60 to be screened out. Additionally, the cells 32*c'* of the spare memory 60 may be implemented with a larger physical size than the cells 32 of the memories 14' and 14". Implementing the cells 32*c'* with a large size may reduce the likelihood and/or effect of fabrication faults in the memory 60.

The present invention may enable an integrated circuit to be usable even if a memory in the integrated circuit may include faulty cells. Such a technique can significantly improve the effective yield of a fabrication process that may be associated with an inherent risk that one or more fabricated memory cells may be faulty. The invention may be efficient in hardware overhead and/or in operation. The built-in test and patch functionality may provide yet further advantages in enabling the memory 14 to be substantially self-patching without involving complicated external testing and reconfiguration.

While the invention has been particularly shown and described with reference to the preferred embodiment thereof, it will be understood by those skilled in the art that various changes in form and details may be made without departing from the spirit and scope of the invention.

The invention claimed is:

1. A circuit comprising:
    a plurality of addressable memory cells; and
    an access control circuit configured to (i) intercept an access to a faulty cell of said plurality of addressable memory cells, and (ii) redirect said access to a spare cell of said plurality of addressable memory cells according to a fault list, wherein said fault list is stored in a non-volatile structure.

2. The circuit of claim 1, wherein said access control circuit further comprises test circuitry for testing said plurality of addressable memory cells to identify said faulty cell.

3. The circuit of claim 2, wherein said test circuitry is configured to generate a list comprising said faulty cell.

4. The circuit according to claim 2, wherein said test circuitry is configured to test each addressable memory cell only once in a first mode and upon each power-up in a second mode.

5. The circuit of claim 1, wherein said access control circuit is further configured to generate an address map that maps said faulty cell to said spare cell to redirect said access.

6. The circuit of claim 1, wherein said access control circuit is configured to (i) receive an access address and (ii) compare said access address with a list of addresses for a plurality of said faulty cells.

7. The circuit of claim 6, wherein said access control circuit is further configured to substitute an address to one of a plurality of said spare cells when said access address is determined to be in said list of addresses.

8. The circuit of claim 1, wherein said spare cell has an address outside an address range of said access.

9. The circuit of claim 1, wherein said spare cell is in a subset of said addressable memory cells that is reserved to handle said access when redirected.

10. The circuit of claim 9, wherein said access control circuitry is further configured to reserve said subset of said addressable memory cells for redirection.

11. The circuit according to claim 1, wherein said spare cell has a larger physical size than the addressable memory cells.

12. The circuit according to claim 1, wherein said spare cell is sized to reduce a likelihood of fabrication faults.

13. The circuit according to claim 1, wherein said plurality of addressable memory cells are configured as a first-in first-out (FIFO) memory.

14. A method of operation in a memory, comprising the steps of:
    (a) receiving an address signal as a request for access to a respective memory cell of a plurality of addressable memory cells in said memory;
    (b) determining whether said address signal corresponds to a faulty cell in said plurality of addressable memory cells; and
    (c) substituting a new address signal for said address signal according to a fault list to access a spare cell of said memory when said address signal is determined to correspond to said faulty cell, wherein said fault list is stored in a non-volatile structure.

15. The method of claim 14, wherein step (b) comprises the sub-step of:
    comparing said address signal with a list of addresses including said faulty cell.

16. The method of claim 14, further comprising the step of:
    testing said plurality of addressable memory cells to identify said faulty cell prior to step (a).

17. The method of claim 14, further comprising the step of:
    generating an address map that maps said faulty cell to said spare cell.

18. The method of claim 14, further comprising the step of:
    accessing said spare cell in response to a control signal.

19. The method of claim 14, wherein said spare cell has an address outside an address range of said address signal.

20. A method of manufacturing a memory, comprising:
    (a) fabricating said memory comprising a plurality of memory cells;
    (b) testing said memory after fabrication to determine whether any of said memory cells are a faulty cell;
    (c) generating a memory patch to replace each of said faulty cells in an address map of said memory cells with one of a plurality of spare cells; and
    (d) storing said memory patch in a non-volatile structure.

21. The method of claim 20, wherein step (b) comprises the sub-step of:
    operating built-in test circuitry in said memory to perform said testing.

22. The method of claim 20, wherein step (c) comprises the sub-step of:
    operating built-in fault handling circuitry in said memory to generate said memory patch.

23. A circuit comprising:
    means for receiving an address signal as a request for access to a respective memory cell of a plurality of addressable memory cells in said circuit;
    means for determining whether said address signal corresponds to a faulty cell in said plurality of addressable memory cells;
    means for substituting a new, address signal for said address signal according to a fault list to access a spare cell of said circuit when said address signal is determined to correspond to said faulty cell, wherein said fault list is stored in a non-volatile structure.

* * * * *